(12) United States Patent
Akiyama et al.

(10) Patent No.: US 7,080,313 B2
(45) Date of Patent: Jul. 18, 2006

(54) SIGNAL EVALUATION APPARATUS AND SIGNAL EVALUATION METHOD

(75) Inventors: Jun Akiyama, Kashihara (JP); Tetsuya Okumura, Neyagawa (JP)

(73) Assignee: Sharp Kabushiki Kaisha, Osaka (JP)

( * ) Notice: Subject to any disclaimer, the term of this patent is extended or adjusted under 35 U.S.C. 154(b) by 355 days.

(21) Appl. No.: 10/307,610

(22) Filed: Dec. 2, 2002

(65) Prior Publication Data

US 2003/0135812 A1 Jul. 17, 2003

(30) Foreign Application Priority Data

Dec. 4, 2001 (JP) ............................. 2001-369955

(51) Int. Cl.
*H03M 13/00* (2006.01)

(52) U.S. Cl. ...................... 714/794; 714/795; 375/341; 375/262

(58) Field of Classification Search ................ 714/794, 714/795, 792; 375/340, 341, 262
See application file for complete search history.

(56) References Cited

U.S. PATENT DOCUMENTS

| | | | | |
|---|---|---|---|---|
| 4,583,078 A | * | 4/1986 | Shenoy et al. | 341/51 |
| 5,774,470 A | * | 6/1998 | Nishiya et al. | 714/703 |
| 5,938,791 A | | 8/1999 | Narahara | 714/795 |
| 6,192,502 B1 | * | 2/2001 | Yamaguchi et al. | 714/795 |
| 6,215,831 B1 | * | 4/2001 | Nowack et al. | 375/340 |
| 6,519,715 B1 | * | 2/2003 | Takashi et al. | 714/32 |
| 6,732,328 B1 | * | 5/2004 | McEwen et al. | 714/795 |

FOREIGN PATENT DOCUMENTS

JP 10-21651 1/1998

* cited by examiner

*Primary Examiner*—Guy Lamarre
*Assistant Examiner*—Fritz Alphonse
(74) *Attorney, Agent, or Firm*—David G. Conlin; David A. Tucker; Edwards Angell Palmer & Dodge LLP (57) ABSTRACT

There is provided a signal evaluation apparatus and signal evaluation method capable of consistently measuring an accurate bit error rate regardless of the distribution profile of the difference of likelihoods (difference metrics) of data sequences. In the signal evaluation apparatus for decoding data sequences by means of maximum likelihood decoding, at least one pair of paths between which a distance has a minimum value are selected by a path selector circuit 10. With regard to the paths selected by the path selector circuit 10, a difference metric obtained by a difference metric calculator circuit 9 is statistically processed by a μ- and σ-calculator circuit 13 to calculate a bit error rate. Then, the bit error rate is corrected by correction means (11, 12, 14) on the basis of the number of measurement samples of the paths selected by the path selector circuit 10 and the number of all samples.

1 Claim, 4 Drawing Sheets

SIGNAL EVALUATION APPARATUS AND SIGNAL EVALUATION METHOD

BACKGROUND OF THE INVENTION

The present invention relates to a signal evaluation apparatus and signal evaluation method for evaluating a reproduction signal of a recording medium.

In recent years, according to the digitization of various sorts of information including image information and audio information, the amount of digital information has been rapidly increased. In accordance with this, optical disks and optical disk apparatuses suitable for increase in capacity and increase in density have been developed. With the development in density increase of the optical disks, reproduction signals read from the optical disks have been degraded in quality, and the evaluation of reproduction signals is important. The evaluation of reproduction signals as described above is used for quality assurance in the shipment stage of the optical disks or used for adjusting each part of optical disk apparatuses so that the reproduction signal has the best quality.

Conventionally, jitter, bit error rate (BER) and the like have been used for the evaluation of optical disks or optical disk apparatuses, and Japanese Patent Laid-Open Publication No. HEI 10-21651 discloses a signal evaluation apparatus appropriate for PRML (Partial Response Maximum Likelihood), which has been used for the reproduction signal processing of optical disk apparatuses.

The above-mentioned signal evaluation apparatus will be described below with reference to the drawings.

Reference is first made to the case where a reproduction signal is decoded by the aforementioned signal evaluation apparatus according to the Viterbi decoding system. A (1,7) RLL code that has a minimum run length limited to one is adopted, and PR (1,2,1) is adopted as a PRML system. The relation between a record bit sequence bk and a state Sk at the time point of sample k (k=0,1,2,3) assumes four states S0, S1, S2 and S3 as shown in Table 1.

TABLE 1

| State | Record Bit | |
|---|---|---|
| $S_k$ | $b_{k-1}$ | $b_k$ |
| S0 | 0 | 0 |
| S1 | 0 | 1 |
| S2 | 1 | 1 |
| S3 | 1 | 0 |

Each state transits to the next state according to the next record bit, and this state transition is called the "branch".

Table 2 shows the relation between the record bit and the state transition, and the number of branches is six because the minimum run length is limited to one.

TABLE 2

| No. | Record Bit | | | State | | Expected Value |
|---|---|---|---|---|---|---|
| | $b_{k-2}$ | $b_{k-1}$ | $b_k$ | $S_{k-1}$ | $S_k$ | $Y_k$ |
| a | 0 | 0 | 0 | S0 | S0 | −1.0 |
| b | 1 | 0 | 0 | S3 | S0 | −0.5 |
| c | 0 | 0 | 1 | S0 | S1 | −0.5 |
| d | 0 | 1 | 1 | S1 | S2 | 0.5 |
| e | 1 | 1 | 1 | S2 | S2 | 1.0 |
| f | 1 | 1 | 0 | S2 | S3 | 0.5 |

According to PR (1,2,1), the reproduction signal level is determined by a 3-bit record bit sequence. Therefore, the expected value, i.e., the reproduction signal level with an ideal waveform free of noise is expressed as an expected value Yk in Table 2. In Table 2, the minimum value and the maximum value of the reproduction signal level with the ideal waveform are standardized to −1 and 1, respectively.

In this case, the branch metric $(Zk-Yk)^2$ of each branch at the time point of sample k is calculated. Zk is the reproduction signal level at the time point of sample k. This "branch metric", which is the square of the difference between the reproduction signal level and the expected value, therefore means the square error of the reproduction signal level with respect to the expected value. The branch metric is used for determining which branch is to be selected when two branches converge into a certain state. Then, a continuous series of branches is called the "path", and a continuous series of selected branches is called the "survival path".

Assuming that the cumulative value of the branch metrics for the survival path in each state at the time of sample k−1 is $m_{k-1}$, then the sum of the value $m_{k-1}$ and the branch metric $bm_k$ at the time point of sample k becomes the cumulative total value of the branch metrics at the time point of sample k.

As described above, since the branch metric means the square error, the cumulative total value of the branch metrics is the sum total of errors. Therefore, the branch of the smaller value of $(m_{k-1}+bm_k)$ is selected.

For example, the branches whose states become S0 at the time point of sample k, are the two of the branch that transits from S0 to S0 and the branch that transits from S3 to S0 according to Table 2. It is postulated that the cumulative values of the branch metrics are $m0_{k-1}$ and $m3_{k-1}$ and the branch metrics are $bma_k$ and $bmb_k$. Accordingly, assuming that the cumulative total values of the branch metrics at the time point of sample k are $m0_k(a)$ and $m0_k(b)$, respectively, then there hold the equations (1) and (2):

$$M0_k(a)=m0_{k-1}+bma_k \quad (1)$$

$$m0_k(b)=m3_{k-1}+bmb_k \quad (2)$$

Further, $m0_k(a)$ and $m0_k(b)$ are compared in magnitude with each other, and the branch of the smaller one is selected.

In this case, if the correct state at the time point of sample k is S0 and the correct transition is a, then there is executed the calculation of the equation (3):

$$\Delta m_k = m0_k(b) - m0_k(a) \quad (3)$$

and this $\Delta m_k$ is called the "difference metric".

Moreover, if the correct state at the time point of sample k is S0 and the correct transition is b, then the difference metric $\Delta m_k$ is expressed by the equation (4):

$$\Delta m_k = m0_k(a) - m0_k(b) \quad (4)$$

That is, the cumulative total value of the branch metrics of the correct transition is subtracted from the cumulative total value of the branch metrics of the erroneous transition. To know the correct state and the correct transition, Japanese Patent Laid-Open Publication No. HEI 10-21651 discloses a method for using the recorded data sequence and a method for delaying the reproduced data sequence when the error rate of the reproduced data sequence is low.

In this case, if the branch to be selected as a result of decoding is the correct branch, then the difference metric Δm_k has a positive value. However, if an erroneous branch is selected, the difference metric has a negative value.

Figure 3:
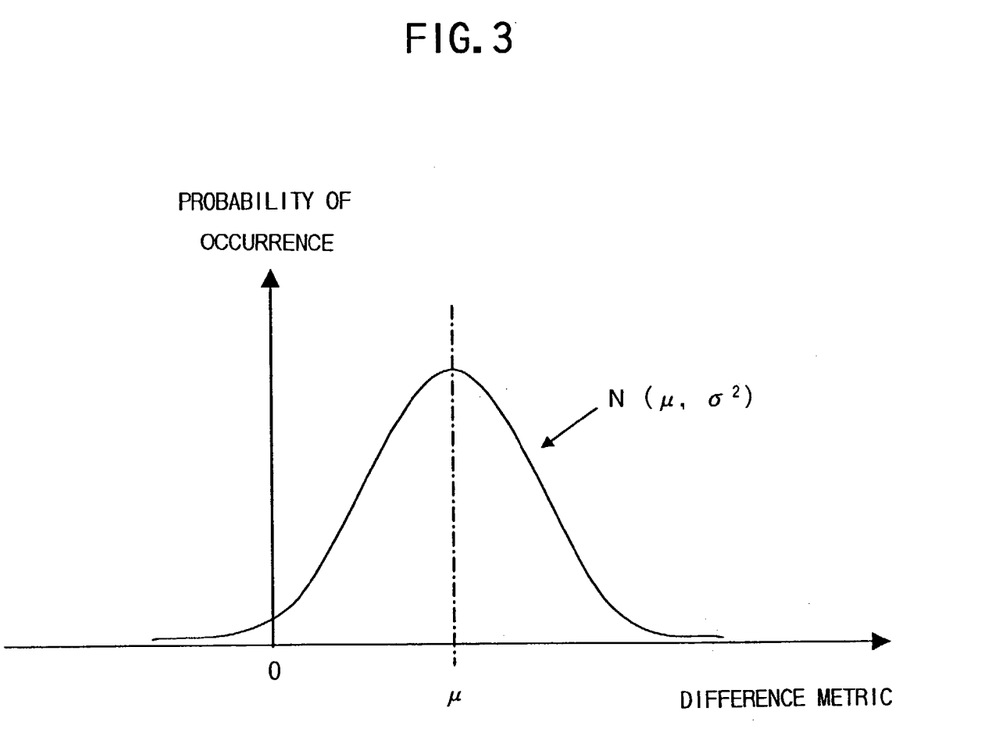
FIG. 3 is an explanatory view showing a difference metric distribution.

FIG. 3 shows the distribution of the difference metrics calculated at each sample time point. Postulating that the normal distribution has a mean value μ and a standard deviation σ on the assumption that the distribution profile can be approximated to the normal distribution, then the probability that the difference metric will become negative is equal to a bit error rate (BER) since the difference metric becomes negative in the case of an error as described hereinbefore. That is, by executing a calculation according to the equation (5):

$$BER = \frac{1}{\sqrt{2\pi} \cdot \sigma} \int_{-\infty}^{0} e^{-\frac{(t-\mu)^2}{2\sigma^2}} dt \quad (5)$$

the bit error rate BER can be estimated. Moreover, when it is only required to know the relative quality of the bit error rate BER of an optical disk or an optical disk apparatus instead of the absolute value of the bit error rate BER, it is acceptable to use σ/μ as an index.

Figure 4:
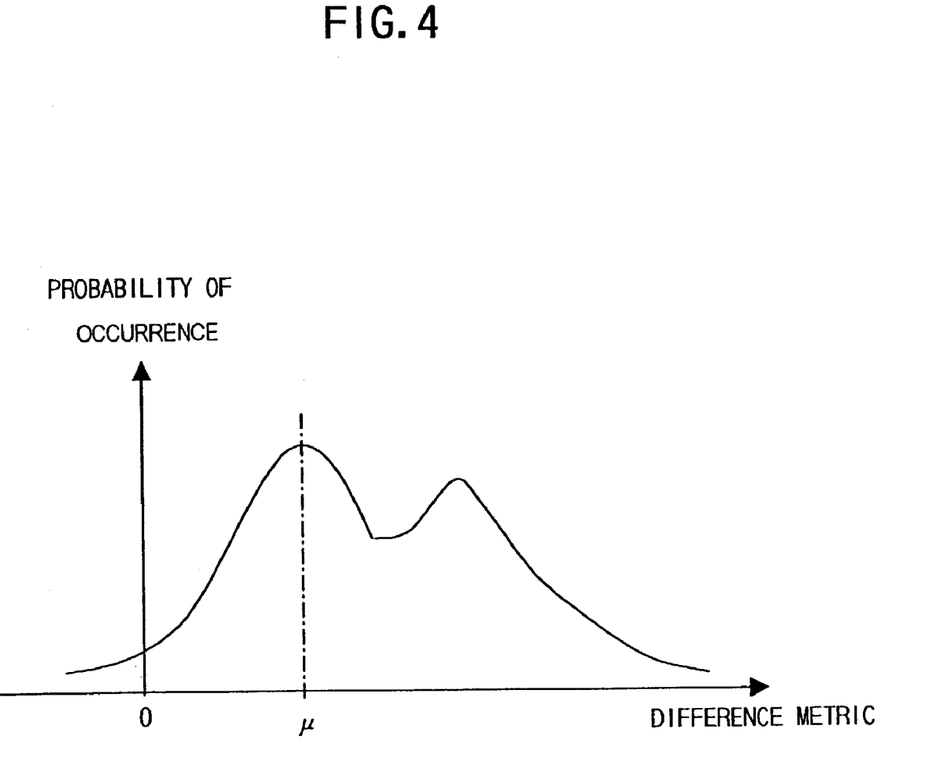
FIG. 4 is an explanatory view showing a difference metric distribution when there is a limitation on the minimum run length.

FIG. 3 shows a distribution that has a single peak. However, when there is a limitation on the minimum run length, there is a distribution that has a plurality of peaks as shown in FIG. 4. Even in this case, assuming that the difference metric distribution conforms to the normal distribution in the region where the difference metric is smaller than the value expressed by the mean value μ shown in FIG. 4 paying attention only to the distribution that has a peak position located nearest to zero, then the bit error rate BER can be calculated similarly to the distribution that has a single peak. However, dissimilarly to the distribution that has a single peak, the mean value μ cannot be obtained from the arithmetic mean. Moreover, if the mean value μ is not obtained, then the standard deviation σ cannot be calculated.

In order to solve this problem, the aforementioned signal evaluation apparatus extracts only the sequence of which the difference metric comes to have the highest probability of becoming negative, i.e., the sequence that passes through the path that forms a distribution that has a peak position located nearest to zero (hereinafter referred to as a "minimum distribution"). In paths as described above, a distance between the two paths has a minimum value, and there are four paths according to this explanation. Table 3 shows four sequences that form the minimum distribution.

By executing this processing, the distribution that has a single peak as shown in FIG. 3 is obtained, and both the mean value μ and the standard deviation a can be calculated comparatively easily.

TABLE 3

| | State | | | |
|---|---|---|---|---|
| No. | $S_{k-3}$ | $S_{k-2}$ | $S_{k-1}$ | $S_k$ |
| A | S0 | S0 | S1 | S2 |
| B | S0 | S1 | S2 | S2 |
| C | S2 | S2 | S3 | S0 |
| D | S2 | S3 | S0 | S0 |

As described above, by extracting only the sequence that passes through a prescribed path from the data sequence, the aforementioned signal evaluation apparatus can obtain the distribution that has a single peak.

However, the aforementioned signal evaluation apparatus extracts only part of the whole data sequence, and therefore, only the bit error rate of part of all the data can be calculated from the obtained distribution. In other words, there is a problem that the aforementioned signal evaluation apparatus cannot obtain the accurate bit error rate of the whole data sequence although the correct bit error rate is the ratio of the number of errors to the number of all the samples.

Since the minimum distribution has a peak position located nearest to zero, it can be considered that almost all the errors occur in the data sequence included in this distribution. Even though the number of generated errors is same, the bit error rate BER is varied when the number of all the samples is varied.

For example, assuming that the number of error is one and the number of samples included in the minimum distribution is 10000, then the error rate of the minimum distribution is $1 \times 10^{-4}$. In this case, if the number of all the measurement samples is equal to the number of samples of the minimum distribution, then the bit error rate BER also becomes $1 \times 10^{-4}$. However, if the number of all the samples is 100000, then the bit error rate BER is $1 \times 10^{-5}$. As described above, even if the number of generated errors is same, the bit error rate BER is varied depending on the ratio of the number of samples included in the minimum distribution to the number of all the samples. The ratio of the number of samples included in the minimum distribution with respect to the number of all the samples varies according to the data pattern to be recorded, and the distribution profile of the difference metrics shown in FIG. 4 also varies.

SUMMARY OF THE INVENTION

Accordingly, the object of the present invention is to provide a signal evaluation apparatus and signal evaluation method capable of always measuring the accurate bit error rate regardless of the distribution profile of the difference of the likelihoods (difference metrics) of data sequences.

In order to achieve the aforementioned object, there is provided a signal evaluation apparatus for decoding data sequences by means of maximum likelihood decoding, comprising:

a subtraction means for obtaining a difference of likelihoods of at least one pair of paths of the data sequences;

a selection means for selecting from the data sequences at least one pair of paths between which a distance has a minimum value;

a calculation means for executing statistical processing of the difference of likelihoods obtained by the subtraction means with regard to the paths selected by the selection means; and a correction means for correcting results of the statistical processing executed by the calculation means on the basis of the number of measurement samples of the paths selected by the selection means and the number of all samples of the data sequences.

According to the signal evaluation apparatus of the above-mentioned construction, the paths between which a distance has a minimum value are selected from the data sequences by the selection means. The paths between which a distance has a minimum value are a pair of paths that diverge from a certain state and subsequently converge earliest in the shortest distance. For the paths between which a distance has a minimum value among the data sequences selected by the selection means, the difference of likelihoods obtained by the subtraction means is statistically processed by the calculation means. The difference of likelihoods of the selected paths forms a minimum distribution. By statistically processing the difference of likelihoods of the selected paths, it is enabled to obtain the mean value and the standard deviation of the minimum distribution as well as the results of statistical processing of the bit error rate and so on from the mean value and the standard deviation. Then, by correcting the results of the statistical processing executed by the calculation means, on the basis of the number of all the samples of the data sequences and the number of the measurement samples of the paths selected by the selection means, the results of the statistical processing of all the data of the data sequences can be obtained. Therefore, the accurate bit error rate can consistently be measured regardless of the distribution profile of the difference of likelihoods (difference metrics) of the data sequences.

Moreover, according to one embodiment, the correction means comprises:

a first counting means for counting the number of measurement samples of the paths selected by the selection means;

a second counting means for counting the number of all the samples of the data sequences; and a bit error rate correction means for correcting a bit error rate, which is a result of the statistical processing executed by the calculation means, on the basis of the number of measurement samples counted by the first counting means and the number of all the samples of the data sequences counted by the second counting means.

According to the above-mentioned embodiment, by correcting the bit error rate, which is the result of the statistical processing executed by the calculation means, on the basis of the number of measurement samples, counted by the first counting means, of the paths selected by the selection means and the number of all the samples of the data sequences counted by the second counting means, the bit error rate of all the data of the data sequences is easily obtained.

Moreover, according to one embodiment, assuming that the number of measurement samples counted by the first counting means is To and the number of all the samples of the data sequences counted by the second counting means is T, then the bit error rate correction means corrects the bit error rate according to the equation:

$$BER1 = BER0 \cdot To/T$$

where BER1 is a bit error rate after correction,
BER0 is a bit error rate before correction,
To is the number of samples of at least one pair of paths between which a distance is minimized, and
T is the number of all samples.

According to the above-mentioned embodiment, the bit error rate correction means is able to execute the correction operation of the bit error rate easily in a short time by using the above-mentioned equation.

The present invention provides a signal evaluation method for decoding a data sequence by means of maximum likelihood decoding, comprising the steps of:

extracting only a data sequence, which passes through a prescribed path, from data sequences;

calculating a bit error rate of the extracted data sequence; and calculating a bit error rate of all data of the data sequences by correcting the bit error rate calculated for the extracted data sequence on the basis of the number of samples of the extracted data sequence and the number of all samples of the data sequences.

According to the above-mentioned signal evaluation method, only the data sequence that passes through the prescribed path is extracted from the data sequences, and the bit error rate is calculated for the extracted data sequence. For example, only the data sequence, which passes through the path of the data sequence that forms the minimum distribution as a prescribed path, is extracted, and the bit error rate of the minimum distribution is obtained from the statistical processing results (mean value and standard deviation) of the difference of likelihoods of the extracted paths. Subsequently, the bit error rate of all the data of the data sequences is calculated by correcting the bit error rate calculated for the extracted data sequence on the basis of the number of samples of the extracted data sequence and the number of all the samples of the data sequences. Therefore, the accurate bit error rate can consistently be measured regardless of the distribution profile of the difference of likelihoods (difference metrics) of the data sequences.

The present invention provides a signal evaluation apparatus for decoding a data sequence by means of maximum likelihood decoding, comprising:

a data sequence extraction means for extracting only a data sequence that passes through a prescribed path, from data sequences;

a bit error rate calculation means for calculating a bit error rate of the data sequence extracted by the data sequence extraction means; and a bit error rate correction means for calculating a bit error rate of all data of the data sequences by correcting the bit error rate calculated by the bit error rate calculation means on the basis of the number of samples of the data sequence extracted by the data sequence extraction means and the number of all samples of the data sequences.

According to the above-mentioned signal evaluation apparatus, only the data sequence that passes through the prescribed path is extracted from the data sequences by the data sequence extraction means, and the bit error rate for the extracted data sequence is calculated by the bit error rate calculation means. For example, only the data sequence, which passes through the path of the data sequence that forms the minimum distribution as a prescribed path, is extracted, and the bit error rate of the minimum distribution is obtained from the statistical processing results (mean value and standard deviation) of the difference of likelihoods of the extracted paths. Subsequently, the bit error rate of all the data of the data sequences is calculated by correcting the bit error rate by the bit error rate correction means on the basis of the number of samples of the extracted data sequence and the number of all the samples of the data sequences. Therefore, the accurate bit error rate can consistently be measured regardless of the distribution profile of the difference of likelihoods (difference metrics) of the data sequences.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENT

The signal evaluation apparatus and signal evaluation method of this invention will be described in detail below on the basis of the embodiment shown in the drawings.

Figure 1:
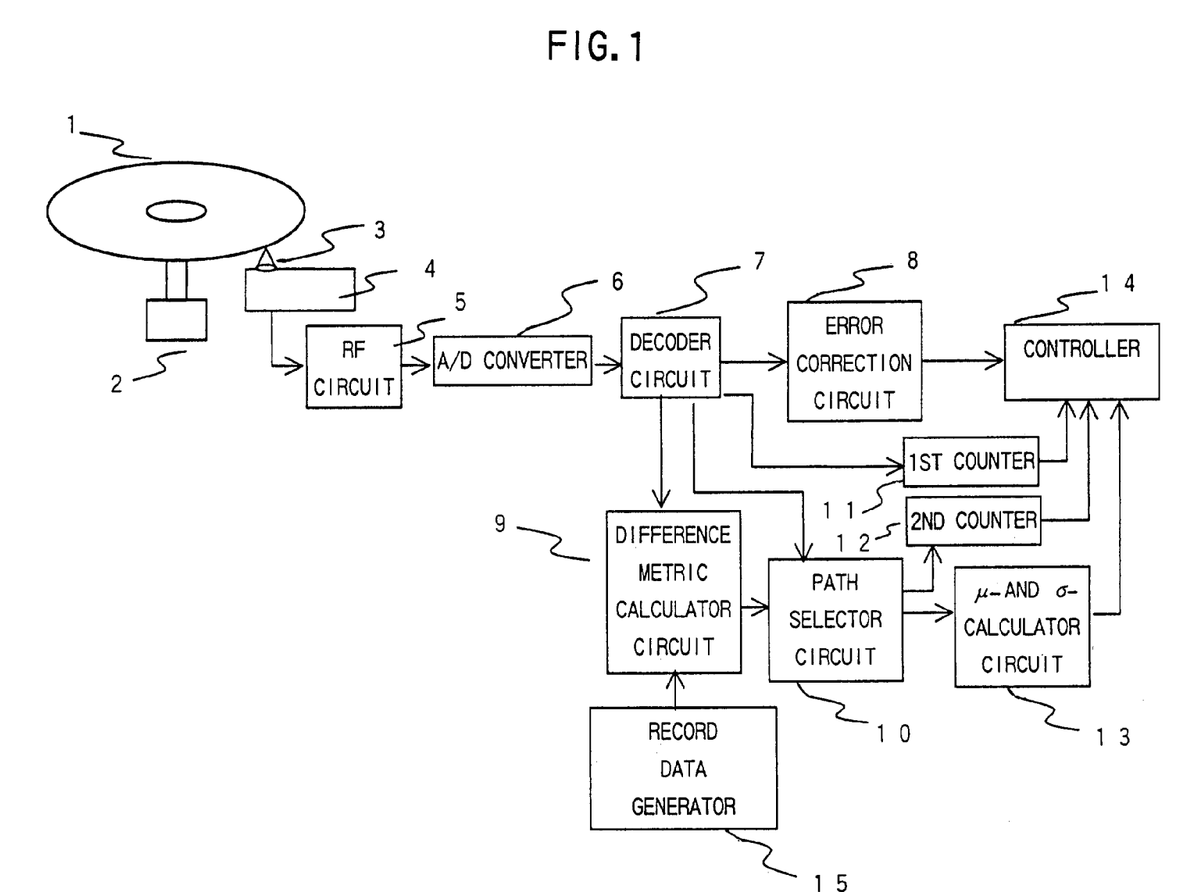
FIG. 1 is a schematic diagram showing an essential part of a reproduction signal processing section of an optical disk apparatus that employs a signal evaluation apparatus according to one embodiment of this invention.

FIG. 1 is a schematic diagram of the essential part of a reproduction signal processing section of an optical disk apparatus employing a signal evaluation apparatus according to one embodiment of this invention. In this embodiment, an optical disk is used as a recording medium, and a reproduction signal is decoded by a Viterbi decoding system. The (1,7) RLL code that has a minimum run length limited to one is adopted, and PR (1,2,1) is adopted as a PRML system.

In FIG. 1 are shown an optical disk 1, a spindle motor 2 for rotatively driving the optical disk 1, an object lens 3, an optical pickup 4, an RF circuit 5 for adjusting the amplitude and so on of a MO signal (Magneto Optical signal) from the optical pickup 4, an A/D converter 6 for subjecting the MO signal from the RF circuit 5 to A/D (analog-to-digital) conversion, a decoder circuit 7 for decoding digital data from the A/D converter 6 by means of maximum likelihood decoding, an error correction circuit 8 for executing error correction of the data decoded by the decoder circuit 7, a difference metric calculator circuit 9 that serves as a subtracting means for obtaining the difference metric of the recorded data sequence decoded by the decoder circuit 7, a path selector circuit 10 that serves as a selecting means for selecting a path from the whole data sequence on the basis of the difference metric obtained by the difference metric calculator circuit 9 and a state transition signal from the decoder circuit 7, a first counter 11 that serves as a second counting means for cumulatively counting the number of all the samples decoded by the decoder circuit 7, a second counter 12 that serves as a first counting means for cumulatively counting the number of samples of the path selected by the path selector circuit 10, a μ- and σ-calculator circuit 13 that serves as a calculating means for statistically processing the difference metric of the path selected by the path selector circuit 10, a controller 14 that serves as a correction operation means and a record data generator 15. The first counter 11, the second counter 12 and the controller 14 constitute a correction means. The path selector circuit 10 serves as a data sequence extraction means, and the controller 14 serves as a bit error rate calculation means and a bit error rate correction means. It is to be noted that a magneto-optical disk is herein used as the optical disk 1 although there is a variety of optical disks.

In the optical disk apparatus of the above-mentioned construction, a beam of light converged by the object lens 3 provided for the optical pickup 4 is applied from below to the recording surface of the optical disk 1. Then, the light reflected on the recording surface of the optical disk 1 is detected by a photodetector provided inside the optical pickup 4, and the reflected light is separated into an MO signal (Magneto Optical signal) and other signals.

The MO signal detected by the optical pickup 4 is subjected to adjustment of amplitude and offset by the RF circuit 5 and thereafter converted into digital data by the A/D converter 6. The digital data outputted from the A/D converter 6 is supplied to the decoder circuit 7, and the decoder circuit 7 executes decoding according to the PRML system.

Next, the data decoded by the decoder circuit 7 is transferred to the error correction circuit 8, and the error correction circuit 8 executes error detection and correction by means of the error detection correction code that has preparatorily been added into the decoded data. The output of this error correction circuit 8 is supplied to the controller 14.

Record data sequence information obtained through the decoding process by the PRML system in the decoder circuit 7 is supplied to the difference metric calculator circuit 9. In order to count the number of samples of the data decoded by the decoder circuit 7 by the first counter 11, one pulse is supplied from the decoder circuit 7 to the first counter 11 every time one sample is decoded. Thus, the number of all the decoded samples is cumulatively counted by the first counter 11.

In the difference metric calculator circuit 9, the same operation as described in connection with the conventional signal evaluation apparatus is executed.

That is, the decoder circuit 7 decodes the reproduction signal of the optical disk 1 according to the Viterbi decoding system. In this case, reference is made to the case where the (1,7) RLL code that has a minimum run length limited to one is adopted as a code to be used and PR (1,2,1) is adopted as the PRML system. The relation between a record bit sequence bk and a state $S_k$ at the time point of sample k is classified into four states S0, S1, S2 and S3 as shown in Table 4.

TABLE 4

| State | Record Bit | |
|---|---|---|
| $S_k$ | $b_{k-1}$ | $b_k$ |
| S0 | 0 | 0 |
| S1 | 0 | 1 |
| S2 | 1 | 1 |
| S3 | 1 | 0 |

Each state transits to the next state according to the next record bit. This state transition is called the branch. Table 5 shows the relation between the record bit and the state transition. As described hereinbefore, the (1,7) RLL code that has a minimum run length limited to one is adopted as a code to be used. That is, the minimum run length is limited to one, and therefore, the number of branches is the six of a, b, c, d, e and f.

TABLE 5

| No. | Record Bit | | | State | | Expected Value |
|---|---|---|---|---|---|---|
| | $b_{k-2}$ | $b_{k-1}$ | $b_k$ | $S_{k-1}$ | $S_k$ | $Y_k$ |
| a | 0 | 0 | 0 | S0 | S0 | −1.0 |
| b | 1 | 0 | 0 | S3 | S0 | −0.5 |
| c | 0 | 0 | 1 | S0 | S1 | −0.5 |
| d | 0 | 1 | 1 | S1 | S2 | 0.5 |
| e | 1 | 1 | 1 | S2 | S2 | 1.0 |
| f | 1 | 1 | 0 | S2 | S3 | 0.5 |

According to PR (1,2,1), the reproduction signal level is determined by a 3-bit record bit sequence. Therefore, the expected value, i.e., the reproduction signal level with the ideal waveform free of noise is entered as an expected value Yk in Table 5. In this case, the minimum value and the maximum value of the reproduction signal level with the ideal waveform are standardized to −1 and 1, respectively.

Then, through the PRML decoding process, the decoder circuit 7 calculates the branch metric $(Zk-Yk)^2$ of each branch at the time point of sample k. In this case, Zk represents the reproduction signal level at the time point of sample k, and Yk represents the expected value of the reproduction signal level. As described above, the branch metric, which is the square of the difference between the reproduction signal level and the expected value, therefore means the square error of the reproduction signal level with respect to the expected value.

Then, the branch metric is used for determining which branch is to be selected when two branches converge into a certain state. Then, a continuous series of branches is called the path, and a continuous series of the selected branches is called the survival path.

Assuming herein that the cumulative value of the branch metrics of the survival path in each state is $m_{k-1}$ at the time of sample k−1, then the sum of the value and the branch metric $bm_k$ at the time point of sample k becomes the cumulative total value of the branch metrics at the time point of sample k. The arithmetic processing to the obtainment of this branch metric is executed by the decoder circuit 7.

As described above, the branch metric means the square error, and therefore, the cumulative total value is the sum total of errors. Therefore, the branch of the smaller value of $m_{k-1}+bm_k$ is selected.

For example, the branches that come to have the state S0 at the time point of sample k are the two branches of the branch "a" that transits from S0 to S0 and the branch "b" that transits from S3 to S0 according to Table 5. Assuming that the cumulative values of the branch metrics of the branch "a" and the branch "b" are $m0_{k-1}$ and $m3_{k-1}$, respectively, and their branch metrics are $bma_k$ and $bmb_k$, then the cumulative total values $m0_k(a)$ and $m0_k(b)$ of the branch metric "a" and the branch metric "b" at the time point of sample k are expressed by the following equations (1) and (2):

$$M0_k(a) = m0_{k-1} + bma_k \quad (1)$$

$$m0_k(b) = m3_{k-1} + bmb_k \quad (2)$$

Further, $m0_k(a)$ and $m0_k(b)$ are compared in magnitude with each other, and the branch of the smaller value is selected.

Herein, when the correct state at the time point of sample k is S0 and the correct transition is a, there is executed the calculation of the equation (3):

$$\Delta m_k = m0_k(b) - m0_k(a) \quad (3)$$

and this $\Delta m_k$ is called the "difference metric".

When the correct state at the time point of sample k is S0 and the correct transition is b, the difference metric ($\Delta m_k$) is expressed by the equation (4):

$$\Delta m_k = m0_k(a) - m0_k(b) \quad (4)$$

That is, the difference metric calculator circuit 9 executes the processing of obtaining the difference metric as a difference of likelihoods by subtracting the cumulative total value of the branch metrics of the correct transition from the cumulative total value of the branch metrics of the erroneous transition.

In the present embodiment, record data sequence information necessary for the calculation in the difference metric calculator circuit 9 is supplied from the record data generator 15 to the difference metric calculator circuit 9.

Then, the difference metric obtained by the difference metric calculator circuit 9 is supplied to the path selector circuit 10.

Moreover, a state transition signal is supplied as information for path selection from the decoder circuit 7 to the path selector circuit 10, and the path selector circuit 10 selects four paths (the distance between the pair of the paths has a minimum value) shown in Table 3 from the whole data sequences. Then, for the paths that coincide with the four paths shown in Table 3, the path selector circuit 10 supplies the difference metrics of the samples included in the coinciding paths to the μ- and σ-calculator circuit 13. At the same time, the same number of pulses as the number of samples of the paths that coincide with the four paths shown in Table 3 are supplied to the second counter 12. Thus, the number of samples of the paths selected by the path selector circuit 10 is cumulatively counted by the second counter 12.

The μ- and σ-calculator circuit 13 calculates the mean value μ and the standard deviation σ of the difference metrics for the paths selected by the path selector circuit 10.

Then, the results of counting executed by the first counter 11 and the second counter 12 and the results of calculation executed by the μ- and σ-calculator circuit 13 are processed by the software of the controller 14.

Figure 2:
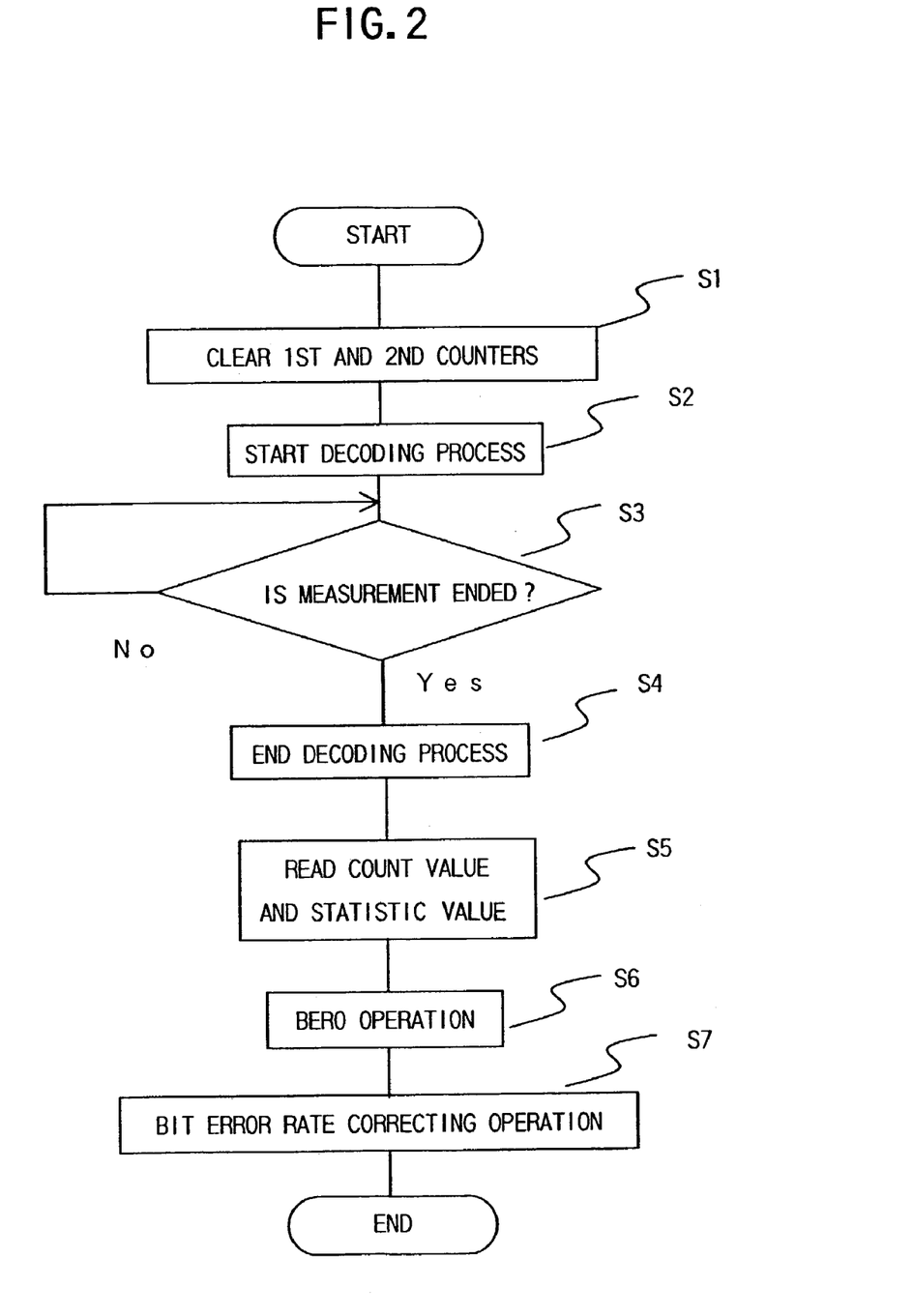
FIG. 2 is a flowchart of the above signal evaluation apparatus.

FIG. 2 shows a flowchart of the entire measurement processing from the start of measurement to the obtainment of measurement results.

First of all, prior to the measurement, the count values of the first and second counters 11 and 12 are cleared to zero in step 1.

Next, the program flow proceeds to step 2 to start the decoding process by reading a prescribed region of the disk 1.

Subsequently, the program flow proceeds to step 3 to determine whether or not the measurement ends and perform measurement for a prescribed period by repeating the step 3 until the measurement ends. During this measurement period, there is executed measurement by the difference metric calculator circuit 9, the path selector circuit 10, the μ- and σ-calculator circuit 13 and the first and second counters 11 and 12. If the measurement ends, then the program flow proceeds to step 4 to end the decoding process.

Next, the program flow proceeds to step 5 to read the number T of all the samples counted by the first counter 11, the number To of the measurement samples counted by the second counter 12 and the mean value μ and the standard deviation σ calculated by the μ- and σ-calculator circuit 13.

Next, the program flow proceeds to step 6 to obtain a bit error rate BER0 before correction from the mean value μ and the standard deviation σ obtained in step 5 according to the following equation (6):

$$BER0 = \frac{1}{\sqrt{2\pi} \cdot \sigma} \int_{-\infty}^{0} e^{\frac{(t-\mu)^2}{2\sigma^2}} dt \quad (6)$$

The bit error rate BER0 obtained here is the bit error rate of the data sequence that forms a minimum distribution.

Next, the program flow proceeds to step 7 to execute the correction operation of the bit error rate. This correction operation converts the bit error rate BER0 obtained in step 6 into a bit error rate BER1 of the whole data sequences according to the following equation (7):

$$BER1 = BER0 \cdot To/T \quad (7)$$

As described above, the bit error rate of the whole data sequences is calculated by obtaining the bit error rate of the minimum distribution from the mean value µ and the standard deviation σ of the difference metrics of the data sequence that forms a minimum distribution and executing the correction operation of the bit error rate.

In the above-mentioned embodiment, the number To of the measurement samples and the number T of all the samples are counted by the first and second counters 11 and 12. However, when the number of samples per sector is determined by the format of a recording medium, it is possible to execute the correction operation of the bit error rate by setting the measurement period in sectors without counting the number T of all the samples.

For example, assuming that one sector has 10000 samples and data of two sectors are measured, then the number T of all the samples become 20000 samples. By so doing, the first counter 11 can be removed, and the construction of the apparatus can be simplified. If it is enabled to count the number T of all the samples by a counter, then a region smaller than one sector can be measured, producing an advantage that precise evaluation of high positional resolution becomes possible. Therefore, it is proper to make appropriate selection taking the simplification of the apparatus construction and the required measurement resolving power into consideration.

It is further acceptable to provide the recording surface of the optical disk with a test region for making an evaluation and record a prescribed test data pattern in the test region. Since the ratio of the minimum distribution to all the data included in this test data pattern is already known, there is no need for counters for counting the number T of all the samples and the number To of the measurement samples. In this case, there is a disadvantage that the region usable by the user is reduced because of the necessity of the special test area, and it is not possible to make an evaluation in an arbitrary place.

As described above, because the bit error rate BER of all the data is calculated by obtaining the bit error rate BER of the minimum distribution from the mean value µ and the standard deviation σ of the difference metrics of the data sequence that forms a minimum distribution and executing the correction operation of the bit error rate of the minimum distribution, the accurate bit error rate BER can consistently be measured regardless of the distribution profile of the difference metrics of the data sequence.

In the above-mentioned embodiment, the magneto-optical disk reproduction apparatus using the signal evaluation apparatus and the signal evaluation method has been described. However, the present invention is not limited to this, and it is acceptable to apply the signal evaluation apparatus and signal evaluation method of this invention to a magnetic recording apparatus, a communication data reception apparatus or the like, which decodes data sequences using the maximum likelihood decoding.

As is apparent from the above, according to the signal evaluation apparatus and signal evaluation method of this invention, the bit error rate of all the data of the data sequences can be obtained by obtaining the bit error rate of the minimum distribution from the statistical processing results (mean value µ and standard deviation σ) of the difference of likelihoods (difference metrics) of the data sequences that form the minimum distribution and executing the correction operation of the error rate. Therefore, the accurate bit error rate can consistently be measured regardless of the distribution profile of the difference of likelihoods (difference metrics) of the data sequences.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A signal evaluation apparatus for decoding data sequences by means of a maximum likelihood decoding, comprising:
    a subtraction means for obtaining a difference of likelihoods of at least one pair of paths of the data sequences;
    a selection means for selecting from the data sequences at least one pair of paths between which a distance has a minimum value;
    a calculation means for executing statistical processing of the difference of likelihoods obtained by the subtraction means with regard to the paths selected by the selection means; and
    a correction means for correcting results of the statistical processing executed by the calculation means on the basis of the number of measurement samples of the paths selected by the selection means and the number of all samples of the data sequence;
    wherein the correction means comprises:
        a first counting means for counting the number of measurement samples of the paths selected by the selection means;
        a second counting means for counting the number of all the samples of the data sequences; and
        a bit error rate correction means for correcting a bit error rate, which is a result of the statistical processing executed by the calculation means, on the basis of the number of measurement samples counted by the first counting means and the number of all the samples of the data sequences counted by the second counting means; and
    wherein, assuming that the number of measurement samples counted by the first counting means is To and the number of all the samples of the data sequences counted by the second counting means is T,
    then the bit error rate correction means corrects the bit error rate according to the equation:

$$BER1 = BER0 \cdot To/T$$

where BER1 is a bit error rate after correction,
    BER0 is a bit error rate before correction,
    To is the number of samples of at least one pair of paths between which a distance is minimized, and
    T is the number of all samples.

* * * * *